(12) United States Patent
Paseuth et al.

(10) Patent No.: US 8,801,817 B2
(45) Date of Patent: Aug. 12, 2014

(54) SURFACE-COATED CUTTING TOOL AND MANUFACTURING METHOD THEREOF

(75) Inventors: Anongsack Paseuth, Itami (JP); Yoshio Okada, Itami (JP); Hideaki Kanaoka, Itami (JP); Chikako Kojima, Itami (JP); Erika Iwai, Itami (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 42 days.

(21) Appl. No.: 13/392,713

(22) PCT Filed: Jul. 4, 2011

(86) PCT No.: PCT/JP2011/065286
§ 371 (c)(1),
(2), (4) Date: Feb. 27, 2012

(87) PCT Pub. No.: WO2012/132032
PCT Pub. Date: Oct. 4, 2012

(65) Prior Publication Data
US 2012/0275870 A1    Nov. 1, 2012

(30) Foreign Application Priority Data

Mar. 31, 2011 (JP) ................................ 2011-079223

(51) Int. Cl.
*C23C 16/00* (2006.01)

(52) U.S. Cl.
USPC ..... 51/307; 51/309; 427/255.15; 427/255.23; 427/255.391; 427/419.1; 427/419.2; 428/336; 428/698; 428/701; 428/702

(58) Field of Classification Search
USPC ............ 51/307, 309; 428/336, 698, 701, 702; 427/255.15, 255.16, 255.23, 255.391, 427/419.1, 419.2
See application file for complete search history.

(56) References Cited

U.S. PATENT DOCUMENTS

| | | | |
|---|---|---|---|
| 5,942,318 A | * | 8/1999 | Soderberg et al. ............. 428/336 |
| 7,597,970 B2 | * | 10/2009 | Fukano et al. ................ 428/701 |
| 7,906,230 B2 | * | 3/2011 | Watanabe et al. ............. 428/698 |
| 2008/0057280 A1 | | 3/2008 | Watanabe et al. |

FOREIGN PATENT DOCUMENTS

| | | | |
|---|---|---|---|
| JP | 57-161058 | * | 4/1982 |
| JP | 57-161058 | * | 10/1982 |
| JP | 05-220604 | * | 8/1993 |
| JP | 06-158325 | * | 6/1994 |
| JP | 07-062542 | * | 3/1995 |
| JP | 08-132130 | * | 5/1996 |
| JP | 08-321130 | * | 5/1996 |
| JP | 10-237648 A | | 9/1998 |
| JP | 11-140647 | * | 5/1999 |
| JP | 2006-231433 A | | 9/2006 |
| JP | 2008-087150 A | | 4/2008 |
| KR | 2008-0022072 A | | 3/2008 |

OTHER PUBLICATIONS

Office Action in Korean Patent Application No. 10-2012-7006194, dated Aug. 26, 2013.

* cited by examiner

*Primary Examiner* — A. A. Turner
(74) *Attorney, Agent, or Firm* — Venable LLP; Michael A. Sartori; Tamatane J. Aga

(57) ABSTRACT

A surface-coated cutting tool according to the present invention includes a base material and a coating film formed on the base material. The coating film includes at least one TiCN layer. The TiCN layer has a columnar crystal region. The columnar crystal region is characterized by having a composition of $TiC_xN_y$ (in which $0.65 \leq x/(x+y) \leq 0.90$) and having a (422) plane having a plane spacing of 0.8765 Å to 0.8790 Å.

3 Claims, No Drawings

SURFACE-COATED CUTTING TOOL AND MANUFACTURING METHOD THEREOF

TECHNICAL FIELD

The present invention relates to a surface-coated cutting tool including a base material and a coating film formed on the base material, and a method of manufacturing the surface-coated cutting tool.

BACKGROUND ART

Conventionally, there is a known surface-coated cutting tool including a base material and a coating film formed on the base material, in which a TiCN layer is included as the coating film.

For example, Japanese Patent Laying-Open No. 2008-087150 (Patent Literature 1) proposes an attempt to improve wear resistance and chipping resistance by setting the atomic ratio of carbon to the sum of carbon and nitrogen at 0.70 to 0.90 as a composition of the TiCN layer.

Furthermore, Japanese Patent Laying-Open No. 2006-231433 (Patent Literature 2) proposes an attempt to improve the chipping resistance by providing a specific inclination angle distribution with respect to the crystal plane of the crystal grain of the TiCN layer.

CITATION LIST

Patent Literature

PTL 1: Japanese Patent Laying-Open No. 2008-087150
PTL 2: Japanese Patent Laying-Open No. 2006-231433

SUMMARY OF INVENTION

Technical Problem

As disclosed in Patent Literature 1, although the wear resistance is reliably improved by increasing the atomic ratio of carbon to the sum of carbon and nitrogen as a composition of the TiCN layer, the coating film is more likely to be peeled off from the base material on the contrary, with the result that the chipping resistance is insufficient when the tool is used for intermittent cutting and the like.

On the other hand, as in Patent Literature 2, although the chipping resistance is reliably improved by providing a specific inclination angle distribution with respect to the crystal plane of the crystal grain of the TiCN layer, the coating film itself cannot be highly hardened, with the result that the wear resistance is insufficient when the tool is used for continuous cutting and the like. Particularly, it was pointed out that the wear resistance becomes insufficient due to the fact that the workpiece is adhered onto a cutting edge during cutting of cast iron, and the like.

The present invention has been made in light of the above-described circumstances. An object of the present invention is to provide a surface-coated cutting tool exhibiting greatly improved wear resistance and chipping resistance.

Solution to Problem

A surface-coated cutting tool according to the present invention includes a base material and a coating film formed on the base material. The coating film includes at least one TiCN layer. The TiCN layer has a columnar crystal region. The columnar crystal region has a composition of $TiC_xN_y$, (in which $0.65 \leq x/(x+y) \leq 0.90$) and has a (422) plane having a plane spacing of 0.8765 Å to 0.8790 Å.

Furthermore, it is preferable that, in the columnar crystal region, TC (422) shows a maximum value in an orientation index TC (hkl). Furthermore, it is preferable that the coating film includes at least one alumina layer, and the alumina layer is made of an α-type aluminum oxide and has an average thickness of 2 μm to 15 μm.

Furthermore, the present invention also relates to a method of manufacturing a surface-coated cutting tool including a base material and a coating film formed on the base material, in which the coating film includes at least one TiCN layer. The method includes the step of forming the TiCN layer. The step is characterized by supplying raw material gas having a volume equal to or greater than 10 times as much as a volume of a reaction chamber of a chemical vapor deposition apparatus to the chemical vapor deposition apparatus per minute, to form the TiCN layer by a chemical vapor deposition method.

Advantageous Effects of Invention

The surface-coated cutting tool according to the present invention is configured as described above to thereby achieve an excellent effect that the wear resistance and the chipping resistance are greatly improved.

DESCRIPTION OF EMBODIMENTS

The present invention will be hereinafter described in greater detail.

<Surface-Coated Cutting Tool>

The surface-coated cutting tool according to the present invention has a configuration including a base material and a coating film formed on the base material. It is preferable that such a coating film covers the entire surface of the base material. However, even if a part of the base material is not covered by this coating film or the configuration of the coating film is partially different, such a structure does not deviate from the scope of the present invention.

The above-described surface-coated cutting tool according to the present invention can be suitably used as a cutting tool such as a drill, an end mill, a cutting edge replaceable-type cutting tip for a drill, a cutting edge replaceable-type cutting tip for an end mill, a cutting edge replaceable-type cutting tip for milling, a cutting edge replaceable-type cutting tip for turning, a metal saw, a gear cutting tool, a reamer, and a tap.

<Base Material>

As the base material used for the surface-coated cutting tool according to the present invention, any material can be used as long as it is conventionally known as the above-described type of base material. For example, the base material is preferably any one of cemented carbide (for example, WC-based cemented carbide or a material containing WC and Co or carbonitride of Ti, Ta, Nb or the like), cermet (mainly composed of TiC, TiN, TiCN, or the like), high-speed steel, ceramics (titanium carbide, silicon carbide, silicon nitride, aluminum nitride, aluminum oxide, and the like), a cubic boron nitride sintered body, a diamond sintered body, and the like.

Among these various base materials, particularly, it is preferable to select WC-based cemented carbide and cermet (particularly, TiCN-based cermet). This is because these base materials are excellent in balance between the hardness and the strength particularly at a high temperature and have excellent characteristics as a base material of the surface-coated cutting tool for the above-described use.

<Coating Film>

The coating film according to the present invention may include other layers as long as it includes at least one TiCN layer. Examples of other layers may include an alumina layer, a TiN layer, a TiBNO layer, a TiCNO layer, and the like.

Such a coating film according to the present invention serves to cover the base material to achieve an effect of improving several characteristics such as wear resistance and chipping resistance.

It is suitable that such a coating film according to the present invention has a thickness of 10 μm to 30 μm, more preferably, 10 μm to 25 μm. When the thickness is less than 10 μm, the wear resistance may be insufficient. When the thickness exceeds 30 μm, the coating film may be peeled off or broken with great frequency when relatively strong stress is applied between the coating film and the base material during the intermittent process.

<TiCN Layer>

The TiCN layer included in the coating film of the present invention has a columnar crystal region. This columnar crystal region is characterized by having a composition of $TiC_xN_y$ (in which $0.65 \leq x/(x+y) \leq 0.90$) and having a (422) plane of a plane spacing (d value) of 0.8765 Å to 0.8790 Å. The TiCN layer according to the present invention is configured as described above to thereby achieve an excellent effect that wear resistance and chipping resistance are greatly improved. It is considered this effect results from the fact that the atomic ratio of carbon to the sum of carbon and nitrogen is increased in titanium carbonitride of the columnar crystal region, to thereby improve the adherence resistance for the workpiece and the wear resistance, and also the fact that the plane spacing of the (422) plane is defined to fall within a prescribed range, to cause a change in the strain within the crystal, with the result that the chipping resistance is improved without degradation in peeling resistance.

The study conducted by the present inventors shows the result that, when the plane spacing of the (422) plane is not controlled, the larger the above-described numerical value of $x/(x+y)$ is, the more readily the coating film peels off from the base material. This result shows that the numerical value of $x/(x+y)$ is increased to thereby increase the hardness and achieve excellent wear resistance, whereas the coating film is readily broken in intermittent cutting and the like, leading to inferior chipping resistance. Thus, the present inventors have performed further examinations to pursue such a condition that the chipping resistance is not decreased while still keeping the above numerical value of $x/(x+y)$ high. Then, the present inventors found that the peeling resistance from the base material can be improved by controlling the crystal plane of the columnar crystal of TiCN. By repeating further examinations, the present inventors also found that the plane spacing of the (422) plane is controlled at 0.8765 Å to 0.8790 Å.

In other words, the reason why both of the wear resistance and the chipping resistance are greatly improved in the TiCN layer of the present invention is mainly that the numerical value of $x/(x+y)$ is set to fall within the above-described range to thereby cause an improvement in wear resistance and also that the plane spacing of the (422) plane is set to fall within the above-described range to thereby cause an improvement in the chipping resistance.

The TiCN layer means a layer composed of titanium carbonitride (TiCN). Also, the TiCN layer according to the present invention is characterized, as described above, by having a columnar crystal region at least as a part thereof. Specifically, this TiCN layer may be entirely formed only of a columnar crystal region or may be formed by including other crystal regions such as a granular crystal region together with the columnar crystal region.

In the present invention, the columnar crystal region means a region composed of columnar crystals. Such a columnar crystal grows in the direction approximately perpendicular to the surface of the base material (that is, in the thickness direction of the coating film). Such a columnar crystal, for example, has a width (diameter) of 50 nm to 500 nm and a length of 1000 nm to 10000 nm.

In the case where the TiCN layer according to the present invention is composed by including other crystal regions such as a granular crystal region together with a columnar crystal region, it is preferable that the proportion of the columnar crystal region in the TiCN layer is set such that the thickness of the columnar crystal region is 50% to 100%, and preferably, 70% to 100%, with respect to the thickness of the entire TiCN layer. When the thickness of the columnar crystal region is less than 50%, the above-described effects of the TiCN layer of the present invention may not be able to be achieved. It is to be noted that the upper limit of the proportion of the columnar crystal region is not particularly limited. This is because the TiCN layer may be composed only of a columnar crystal region in the present invention. In addition, the granular crystal region corresponding to other crystal region means a region composed of granular crystals. The granular crystal means not a crystal growing in one direction like a columnar crystal, but a crystal having an approximately spherical shape or an indefinite shape and having a grain size of 100 nm to 1000 nm.

In the case where the TiCN layer according to the present invention is composed by including other crystal regions such as a granular crystal region together with a columnar crystal region, it is preferable to form other crystal regions on the base material side and form a columnar crystal region on the surface side of the coating film. The configuration as described above can provide an advantage that the thermal stress resulting from the difference of the thermal expansion coefficient between the base material and the coating film can be alleviated during temperature rise/cooling to some extent, to disperse the energy to cause a crack to develop. In addition, when the TiCN layer according to the present invention is composed in this way by including other crystal regions such as a granular crystal region together with a columnar crystal region, the TiCN layer can be regarded as having a two-layer structure including a TiCN layer composed only of a columnar crystal region and the second TiCN layer composed only of other crystal regions. However, even if the TiCN layer is regarded in any way, such a structure does not deviate from the scope of the present invention, and there is no significance in making a distinction about the structures described above.

The TiCN layer according to the present invention is characterized by having a composition of $TiC_xN_y$ (in which $0.65 \leq x/(x+y) \leq 0.90$) in the columnar crystal region, as described above. This composition means that the atomic ratio of carbon to the sum of carbon and nitrogen is increased in TiCN. When $x/(x+y)$ is less than 0.65, sufficient hardness and lubricity c of be achieved, and therefore, wear resistance is not improved. Furthermore, when $x/(x+y)$ exceeds 0.90, the TiCN layer becomes very brittle, leading to a decrease in impact resistance (chipping resistance). The more preferable range of $x/(x+y)$ is 0.67 to 0.87. In addition, with regard to the atomic ratio of "Ti" to the sum of "C" and "N" in $Ti_xN_y$, the sum of "C" and "N" is preferably set at 0.80 to 1.10 when "Ti" is assumed to be 1. In the present invention, with regard to the chemical formulas "TiCN" and "$TiC_xN_y$", "Ti" does not necessarily indicate that the atomic ratio is 1, but indicates that every atomic ratio that is conventionally known is included (in this regard, each of "TiN", "TiCNO", "TiBNO" and the like described later also has every atomic ratio that is conventionally known unless otherwise specified).

It is to be noted that the composition of the coating film including a composition of the TiCN layer (the atomic ratio between carbon and nitrogen) can be checked by measuring the cross section of the coating film using an EDX (energy dispersive X-ray spectroscopy) device. Furthermore, a crystal shape and the like of the alumina layer described later can be checked by measuring a diffraction pattern using an XRD (X-ray diffraction) device.

Furthermore, the TiCN layer according to the present invention is characterized in that the plane spacing of the (422) plane is 0.8765 Å to 0.8790 Å the columnar crystal region. When the plane spacing of the (422) plane is less than 0.8765 Å, wear resistance cannot be sufficiently achieved in cast-iron cutting. Furthermore, when the plane spacing of the (422) plane exceeds 0.8790 Å, strain in the crystal is increased, which results in a decrease in chipping resistance and peeling resistance. The more preferable range of the plane spacing of the (422) plane is 0.8767 Å to 0.8786 Å.

The plane spacing of the (422) plane as described above can be calculated by making a measurement using an XRD (X-ray diffraction) device. For example, it is preferable to employ the measurement conditions as described below.

Characteristic X-ray: Cu-Kα
Monochromator: Graphite (002) plane
Divergence slit: 1°
Scattering slit: 1°
Light-receiving slit: 0.15 mm
Scan speed: 6°/min
Scan step: 0.03°

Furthermore, it is preferable that, in the columnar crystal region of the TiCN layer according to the present invention, TC (422) shows a maximum value in orientation index TC (hkl). Here, orientation index TC (hkl) is defined by the following Equation (1).

[Equation 1]

$$TC(hkl) = \frac{I(hkl)}{I_0(hkl)} \left\{ \frac{1}{8} \sum \frac{I(hkl)}{I_0(hkl)} \right\}^{-1} \quad (1)$$

In Equation (1), I (hkl) shows the X-ray diffraction strength of the (hkl) plane, and $I_0$ (hkl) shows the average value of the X-ray powder diffraction strength of TiC and TiN forming the (hkl) plane in accordance with JCPDS (Joint Committee on Powder Diffraction Standards (powder X-ray diffraction standards)). It is to be noted that (hkl) represents 8 planes including (111), (200), (220), (311), (331), (420), (422), and (511), and the braces on the right side of Equation (1) shows the average value of these 8 planes.

The meaning that TC (422) shows a maximum value in orientation index TC (hkl) is that TC (422) shows a maximum value when Equation (1) is employed to calculate orientation index TC (hkl) for the above-described all 8 planes. In other words, this shows that the columnar crystals of TiCN are strongly oriented in the (422) plane. The (422) plane is defined as an orientation plane in this way, so that the columnar crystals grow together in the direction perpendicular to the surface of the base material. This causes the coating film to uniformly wear, thereby allowing improvement in wear resistance and chipping resistance.

It is suitable that such a TiCN layer according to the present invention has a thickness of 5 μm to 16 μm, and more preferably, 7 μm to 13 μm. When its thickness is less than 5 μm, the TiCN layer may not be able to sufficiently exert wear resistance in the continuous process. When the thickness exceeds 16 μm, chipping resistance may not be stabilized in intermittent cutting.

<Alumina Layer>

It is preferable that the coating film according to the present invention includes at least one alumina layer together with the above-described TiCN layer. Such an alumina layer according to the present invention is composed of an α-type aluminum oxide and has an average thickness of 2 μm to 15 μm.

Such an alumina layer is preferable since it is excellent in oxidation resistance, excellent in resistance to wear (oxidation wear) occurring due to heat generated during high-speed cutting of steel, and also excellent in adherence resistance at the time of cutting of a cast product. Since the alumina layer according to the present invention has an effect as described above, it is preferable that this alumina layer is formed on the surface side in the coating film with respect to the above-described TiCN layer.

In addition, when the thickness of the alumina layer is less than 2 μm, the wear resistance during high-speed cutting may become insufficient. Also, when the thickness of the alumina layer exceeds 15 μm, the breakage resistance may be degraded in intermittent cutting and an economical disadvantage may arise. The more preferable average thickness of the alumina layer is 3 μm to 10 μm.

<Other Layers>

The coating film according to the present invention can include layers other than the above-described TiCN layer and alumina layer. Examples of such other layers may include, but are not limited to, an underlying layer made of TiN, TiC, TiBN and the like and formed directly above the base material for further enhancing adherence between the base material and the coating film, an intermediate layer made of TiCNO, TiBNO and the like and formed between the TiCN layer and the alumina layer for improving the adherence therebetween, an outermost layer made of TiN, TiCN, TiC and the like and formed on the outermost surface of the coating film for indicating as to whether the cutting edge has been used or not, and the like.

The above-described other layers can generally be formed to have a thickness of 0.5 μm to 2.0 μm.

<Manufacturing Method>

The present invention also relates to a method of manufacturing a surface-coated cutting tool including a base material and a coating film that is formed on the base material and includes at least one TiCN layer. The manufacturing method includes the step of forming the TiCN layer. This step is characterized by supplying raw material gas having a volume equal to or greater than 10 times as much as the volume of the reaction chamber of the chemical vapor deposition apparatus to the chemical vapor deposition apparatus per minute, to thereby form the TiCN layer by a chemical vapor deposition method. In other words, the TiCN layer according to the present invention as described above (particularly, its columnar crystal region) can be formed by the above-described manufacturing method.

Thus, in the manufacturing method according to the present invention, the raw material gas is introduced at a large flow rate to the chemical vapor deposition apparatus, to cause the forced convection of the raw material gas to occur within the reaction chamber of this apparatus, thereby allowing formation of the structure of the TiCN layer that is characteristic as described above. The detailed mechanism is not yet solved as to why the TiCN layer is configured to have a characteristic structure as described above by employing the above-described conditions. It is, however, surmised that this is because the crystal of the TiCN layer may probably grow while producing specific strain within the crystal.

In this case, the volume indicating the flow rate of the above-described raw material gas is determined based on the temperature and the pressure at the time when the TiCN layer is formed in the reaction chamber. When the above-described flow rate of the raw material gas is less than 10 times as much as the volume of the reaction chamber of the chemical vapor deposition apparatus, the TiCN layer according to the present invention cannot be formed with stability. Furthermore, the upper limit of the flow rate of the above-described raw material gas does not need to be particularly limited. However, in consideration of the durability and the breakage risk of the chemical vapor deposition apparatus and the uniformity of the TiCN layer to be produced, it is preferable that the upper limit is set to be not more than 20 times as much as the volume of the reaction chamber.

The composition of the above-described raw material gas to be used may include such a composition that is conventionally known as raw material gas used for forming the TiCN layer by the chemical vapor deposition method, without any particular limitation. An example of the composition may include mixed gas made of $TiCl_4$, $CH_3CN$, $C_2H_4$, and $H_2$. It is preferable to use $C_2H_4$ (ethylene) particularly in this mixed gas and increase the mixing ratio of $H_2$, which allows improvement in the $x/(x+y)$ ratio in the $TiC_xN_y$ film even at a relatively low film forming temperature.

With regard to the TiCN layer according to the present invention, as long as the above-described conditions are employed, the conventionally known conditions can be employed for other conditions such as a reaction temperature and pressure without any particular limitation. In addition, when the coating film of the present invention includes layers other than the TiCN layer, these layers can be formed by the conventionally known chemical vapor deposition method and physical vapor deposition method. Although the formation method thereof is not particularly limited, it is preferable to form these layers by the chemical vapor deposition method in terms of the fact that these layers can be formed consecutive with the TiCN layer within one chemical vapor deposition apparatus.

EXAMPLES

Although the present invention will be hereinafter described in greater detail with reference to Examples, the present invention is not limited thereto.

<Preparation of Base Material>

Five types of base materials A to E shown in the following Table 1 were prepared. Specifically, the raw material powder having a blending composition shown in Table 1 was uniformly mixed and molded in a predetermined shape, which was then sintered at 1300° C. to 1500° C. for 1 to 2 hours, thereby forming a base material made of cemented carbide and having a shape of CNMG120408 N-GZ (manufactured by Sumitomo Electric Hardmetal Corp.).

TABLE 1

| | Blending Composition (% by Mass) | | | | | |
|---|---|---|---|---|---|---|
| | Co | TiC | $Cr_3C_2$ | NbC | TaC | WC |
| A | 5 | — | 0.5 | — | — | Remainder |
| B | 5.4 | 0.15 | — | 0.3 | 0.5 | Remainder |
| C | 5.8 | — | — | — | — | Remainder |

TABLE 1-continued

| | Blending Composition (% by Mass) | | | | | |
|---|---|---|---|---|---|---|
| | Co | TiC | $Cr_3C_2$ | NbC | TaC | WC |
| D | 6 | — | — | 1.5 | — | Remainder |
| E | 10 | — | 0.5 | — | — | Remainder |

<Formation of Coating Film>

The coating film was formed on the surface of the base material prepared as described above. Specifically, the coating film was formed on the base material by the chemical vapor deposition method by placing the base material within the chemical vapor deposition apparatus (the volume of the reaction chamber: 0.27 m³). The formation conditions of the coating film are as described in the following Tables 2 and 3. Table 2 shows the formation conditions of each layer other than the TiCN layer, and Table 3 shows the formation conditions of the TiCN layer. As shown in Table 3, there are ten types of formation conditions "a" to "j" for the TiCN layer, in which conditions "a" to "g" are the conditions in accordance with the method of the present invention while conditions "h" to "j" are the conditions in accordance with the conventional technique.

For example, formation condition "a" shows that the raw material gas having a composition including 2.0% by volume of $TiCl_4$, 0.4% by volume of $CH_3CN$, 3.0% by volume of $C_2H_4$, and the remainder containing $H_2$ was supplied at the flow rate of 17 times as much as the volume of the reaction chamber of the chemical vapor deposition apparatus per minute into the chemical vapor deposition apparatus, to form a TiCN layer under the conditions of a pressure of 9.0 kPa and a temperature of 820° C. In addition, the amount of the above-described raw material gas to be supplied was determined by calculating the volume under ordinary temperatures and pressures (30° C., 1 atmosphere pressure) using the gas equation such that this amount of the gas to be supplied was 17 times as much as the volume of the reaction chamber under the conditions of a pressure of 9.0 kPa and a temperature of 820° C.

In Table 3, with regard to the TiCN layer obtained under each condition, "$x/(x+y)$" shows $x/(x+y)$ of $TiC_xN_y$ in the columnar crystal region, "plane spacing" shows the plane spacing of the (422) plane in the columnar crystal region, "TC (hkl)" shows as to which crystal plane shows a maximum value in orientation index TC (hkl) in the columnar crystal region, and "peeling critical load" shows the results of the peeling test.

The conditions of the above-described peeling test are as described below. Specifically, a scratch tester (trademark: "Revetest Scratch Tester") was used as a test apparatus. The test was assumed to be conducted for the object which was obtained by performing CVD deposition of a TiN layer on the base material and then forming only a TiCN layer on the base material. Then, measurements were performed three times under the following conditions to determine the average value thereof (unit: N). The results show that the greater the numerical value is, the less the TiCN layer is likely to be peeled off from the base material.

<Peeling Test Conditions>

Indenter: Diamond, R=0.2 mm, vertex angle: 120°

Scratch speed: 10 mm/min

Loading speed: 100 N/min

TABLE 2

| Reaction Gas Composition (% by Volume) | Film Forming Conditions | | |
|---|---|---|---|
| | Pressure (kPa) | Temperature (° C.) | Flow Rate (Times) |
| TiN (Underlying Layer) $TiCl_4$ = 0.9%, $N_2$ = 39.7%, $H_2$ = Remainder | 6.7 | 840 | 6.0 |
| TiN (Outermost Layer) $TiCl_4$ = 0.5%, $N_2$ = 41.2%, $H_2$ = Remainder | 79.8 | 980 | 5.0 |
| TiBNO (Intermediate Layer) $TiCl_4$ = 36.7%, $BCl_3$ = 0.1%, CO = 1.6%, $CO_2$ = 1.7%, $N_2$ = 61.7%, $H_2$ = Remainder | 6.7 | 980 | 6.0 |
| TiCNO (Intermediate Layer) $TiCl_4$ = 2.1%, CO = 3.2%, $CH_4$ = 2.8%, $N_2$ = 23.7%, $H_2$ = Remainder | 16.0 | 1030 | 7.0 |
| $Al_2O_3$ (Alumina Layer) $AlCl_3$ = 1.6%, $CO_2$ = 4.5%, $H_2S$ = 0.2%, HCl = 3.5%, $H_2$ = Remainder | 6.7 | 980 | 4.0 |

TABLE 3

| | Reaction Gas Composition (% by Volume) | Film Forming Conditions | | | Properties of TiCN Layer | | | |
|---|---|---|---|---|---|---|---|---|
| | | Pressure (kPa) | Temperature (° C.) | Flow Rate (Times) | x/(x + y) | Plane Spacing (Å) | TC (hkl) | Peeling Critical Load |
| a | $TiCl_4$ = 2.0%, $CH_3CN$ = 0.4%, $C_2H_4$ = 3.0%, $H_2$ = Remainder | 9.0 | 820 | 17.0 | 0.70 | 0.8767 | (422) | 48.6 |
| b | $TiCl_4$ = 2.0%, $CH_3CN$ = 0.3%, $C_2H_4$ = 3.7%, $H_2$ = Remainder | 9.0 | 840 | 15.0 | 0.74 | 0.8773 | (422) | 49.8 |
| c | $TiCl_4$ = 2.3%, $CH_3CN$ = 0.3%, $C_2H_4$ = 3.7%, $H_2$ = Remainder | 15.0 | 840 | 10.0 | 0.89 | 0.8787 | (422) | 47.9 |
| d | $TiCl_4$ = 2.0%, $CH_3CN$ = 0.25%, $C_2H_4$ = 3.7%, $H_2$ = Remainder | 9.0 | 840 | 18.0 | 0.80 | 0.8779 | (422) | 48.0 |
| e | $TiCl_4$ = 1.8%, $CH_3CN$ = 0.25%, $C_2H_4$ = 3.7%, $N_2$ = 14.4%, $H_2$ = Remainder | 9.0 | 840 | 20.0 | 0.79 | 0.8780 | (422) | 48.0 |
| f | $TiCl_4$ = 2.0%, $CH_3CN$ = 0.2%, $C_2H_4$ = 3.7%, $H_2$ = Remainder | 9.0 | 850 | 16.0 | 0.88 | 0.8786 | (422) | 47.8 |
| g | $TiCl_4$ = 2.0%, $CH_3CN$ = 0.3%, $C_2H_4$ = 4.9%, $H_2$ = Remainder | 8.5 | 830 | 18.0 | 0.80 | 0.8779 | (422) | 48.3 |
| h | $TiCl_4$ = 3.0%, $CH_3CN$ = 0.2%, $C_2H_4$ = 2.1%, $H_2$ = Remainder | 8.0 | 830 | 3.0 | 0.81 | 0.8805 | (422) | 32.7 |
| i | $TiCl_4$ = 0.8%, $CH_3CN$ = 0.8%, $C_2H_4$ = 2.4%, $N_2$ = 25%, $H_2$ = Remainder | 40.0 | 780 | 2.0 | 0.57 | 0.8759 | (422) | 35.6 |
| j | $TiCl_4$ = 2.1%, $CH_3CN$ = 0.4%, $N_2$ = 14.9%, $H_2$ = Remainder | 7.0 | 860 | 9.5 | 0.57 | 0.8757 | (422) | 40.3 | the conditions shown in Table 2, on which a TiCN layer having a thickness of 12.0 μm was formed under formation condition "b" shown in Table 3, on which a TiBNO layer having a thickness of 0.5 μm as an intermediate layer, an α-$Al_2O_3$ (α-type aluminum oxide) layer having a thickness of 5.5 μm as an alumina layer and a TiN layer having a thickness of 1.0 μm as an outermost layer were formed in this order under the conditions shown in Table 2, to thereby form a coating film having a total thickness of 19.5 μm on the base material. The TiCN layer of the surface-coated cutting tool of sample number 4 is composed only of a columnar crystal region having a thickness of 12.0 μm. In this case, the columnar crystal region has a composition of $TiC_xN_y$, in which x/(x+y) is 0.74, the plane spacing of the (422) plane is 0.8773 Å, and TC (422) shows a maximum value in orientation index TC (hkl).

Furthermore, for example, the TiCN layer of sample number 18 shows that a layer having a thickness of 1.5 μm was formed under formation condition "j" shown in Table 3, on which a layer having a thickness of 8.5 μm was then formed under formation condition "d". In this case, since formation condition "j" is not the condition of the present invention but the condition of the conventional technique, the region formed under formation condition "j" is formed as a granular crystal region. On the other hand, since formation condition "d" is the condition of the present invention, the region formed under formation condition "d" is formed as a columnar crystal region. Furthermore, this columnar crystal region has a composition of $TiC_xN_y$, in which x/(x+y) is 0.80, the plane spacing of the (422) plane is 0.8779 Å, and TC (422) shows a maximum value in orientation index TC (hkl).

In addition, since the TiCN layers of sample numbers 31 to 36 each are formed under the conditions of the conventional technique, these TiCN layers are to be composed only of a granular crystal region or composed by a columnar crystal region which does not exhibit properties such as those of the present invention.

It is to be noted that each of blank columns in Table 4 shows that the relevant layer is not formed.

In addition, the composition and the crystal state of each coating film were checked by SEM-EDX (scanning electron microscope-energy dispersive X-ray spectroscopy) and XRD.

<Production of Surface-Coated Cutting Tool>

Surface-coated cutting tools (cutting edge replaceable-type cutting tips) of sample numbers 1 to 25 and 31 to 36 shown in the following Table 4 were produced as described above. Sample numbers 1 to 25 correspond to Examples of the present invention while sample numbers 31 to 36 correspond to Comparative Examples.

For example, the table shows that the surface-coated cutting tool of sample number 4 has a configuration in which base material D shown in Table 1 was employed as a base material, to form a TiN layer having a thickness of 0.5 μM as an underlying layer on the surface of base material D under

TABLE 4

| Sample No. | Type of Base Material | Configuration of Coating Film | | | | | |
|---|---|---|---|---|---|---|---|
| | | Underlying Layer (TiN layer) (μm) | TiCN Layer (μm) | Intermediate Layer (μm) | Alumina Layer (μm) | Outermost Layer (TiN Layer) (μm) | Total Thickness of Coating Film (μm) |
| 1 | A | 0.5 | b(11.0) | TiBNO(0.6) | 6.0 | — | 18.1 |
| 2 | B | 0.6 | b(10.5) | TiBNO(0.7) | 5.5 | — | 17.3 |
| 3 | C | 0.6 | a(6.7) | TiCNO(0.6) | 4.0 | — | 11.9 |
| 4 | D | 0.5 | b(12.0) | TiBNO(0.5) | 5.5 | 1.0 | 19.5 |
| 5 | A | 0.4 | c(15.4) | TiBNO(0.6) | 6.0 | — | 22.4 |
| 6 | B | 1.0 | d(7.3) | TiCNO(0.8) | 8.0 | 0.5 | 17.6 |
| 7 | B | 0.7 | e(13.0) | TiBNO(0.6) | 6.0 | — | 20.3 |
| 8 | A | 0.5 | f(5.2) | TiBNO(0.7) | 10.0 | — | 16.4 |
| 9 | D | 0.8 | g(7.0) | TiCNO(0.5) | 7.0 | 1.0 | 16.3 |
| 10 | C | 1.0 | b(8.5) | TiBNO(0.6) | 3.5 | — | 13.6 |
| 11 | A | 0.6 | a(14.8) | TiBNO(0.8) | 10.0 | — | 26.2 |
| 12 | B | 0.5 | b(5.1) | TiCNO(0.8) | 12.0 | 0.5 | 18.9 |
| 13 | E | 0.5 | e(10.6) | TiBNO(0.6) | 10.0 | 1.0 | 22.7 |
| 14 | D | 0.7 | a(7.5) | TiCNO(0.6) | 3.0 | — | 11.8 |
| 15 | B | 0.5 | e(10.0) | TiCNO(0.6) | 6.0 | 0.5 | 17.6 |
| 16 | D | 0.8 | b(15.0) | TiBNO(0.6) | 5.0 | — | 21.4 |
| 17 | A | 0.7 | j + b(1.0 + 9.5) | TiBNO(0.6) | 5.6 | — | 17.4 |
| 18 | B | 0.5 | j + d(1.5 + 8.5) | TiBNO(0.7) | 6.0 | 0.5 | 17.7 |
| 19 | C | 1.0 | j + a(1.0 + 12.5) | TiBNO(1.0) | 4.0 | — | 19.5 |
| 20 | D | 0.6 | j + e(2.0 + 5.5) | TiCNO(0.6) | 4.0 | — | 12.7 |
| 21 | B | 0.5 | i + b(1.0 + 9.5) | TiBNO(1.0) | 6.0 | — | 18.0 |
| 22 | C | 0.6 | i + c(1.0 + 5.5) | TiBNO(0.6) | 3.5 | 0.5 | 11.7 |
| 23 | D | 0.6 | j + b(1.0 + 5.0) | TiCNO(0.6) | 4.0 | — | 11.2 |
| 24 | A | 0.4 | j + h + b(1.0 + 3.0 + 5.0) | TiBNO(0.6) | 6.0 | — | 16.0 |
| 25 | B | 0.6 | i + h + a(1.0 + 4.0 + 6.0) | TiBNO(0.6) | 6.0 | — | 18.2 |
| 31 | A | 0.6 | h(10.5) | TiCNO(0.6) | 4.7 | 1.0 | 17.4 |
| 32 | A | 0.6 | i(10.8) | TiCNO(0.4) | 6.0 | — | 17.8 |
| 33 | B | 0.6 | j(12.5) | TiBNO(0.7) | 5.5 | — | 19.3 |
| 34 | C | 0.6 | h(7.8) | TiCNO(0.6) | 4.0 | 1.2 | 13.0 |
| 35 | D | 0.6 | i(8.5) | TiCNO(0.5) | 6.0 | — | 15.6 |
| 36 | C | 0.6 | j(9.0) | TiBNO(0.6) | 5.5 | 1.5 | 17.2 |

<Cutting Test>
The surface-coated cutting tools obtained as described above were used to perform three types of cutting tests as described below.
<Cutting Test 1>
With regard to each of the surface-coated cutting tools of the sample numbers shown in the following Table 5, the cutting time shown in Table 5 was measured until the wear amount of the flank face reached 0.30 mm under the following cutting conditions, and the final damage state of the cutting edge was observed. The results thereof are shown in Table 5. The results show that the longer the cutting time is, the more the wear resistance is excellent. Furthermore, the results also show that the more the final damage state is close to the state of normal wear, the more the chipping resistance is excellent.
<Cutting Conditions>
Workpiece: cut outer periphery of FCD700 round bar
Circumferential speed: 250 m/min
Feeding speed: 0.3 mm/rev
Cutting amount: 2.0 mm
Cutting fluid: existing

TABLE 5

| Sample No. | Cutting Time (Minute) | Final Damage State |
|---|---|---|
| 1 | 16.0 | Normal Wear |
| 2 | 15.5 | Normal Wear |
| 5 | 17.0 | Normal Wear |
| 6 | 16.0 | Normal Wear |
| 7 | 18.5 | Normal Wear |
| 8 | 16.5 | Micro-Chipping of End Cutting Edge |
| 11 | 20.0 | Normal Wear |
| 12 | 18.5 | Normal Wear |
| 15 | 18.0 | Normal Wear |
| 17 | 20.0 | Normal Wear |
| 18 | 18.0 | Normal Wear |
| 21 | 22.0 | Micro-Chipping of End Cutting Edge |
| 24 | 19.0 | Normal Wear |
| 25 | 21.0 | Normal Wear |
| 31 | 7.5 | Chipping of Cutting Edge Tip |
| 32 | 4.5 | Breakage by Adherence |
| 33 | 6.0 | Chipping |

As can be seen from Table 5, it is apparent that Examples (sample numbers 1 to 25) of the present invention are excellent both in wear resistance and chipping resistance as compared to Comparative Examples (sample numbers 31 to 33).

Furthermore, in the final damage state in Table 5, "normal wear" means a damage state caused only by wearing without occurrence of chipping, breakage and the like (having a smooth wearing surface), "micro-chipping of end cutting edge" means an extremely small chipped portion occurring in the cutting edge portion forming a finished surface, "chipping of cutting edge tip" means a small chipped portion occurring in a rounded-corner portion and a chamfer portion of the tip portion of the tool, "breakage by adherence" means that a tool is broken due to repetition of bonding or adherence of a part of the workpiece with or to the cutting edge during the cutting process, and "chipping" means a small chipped portion occurring in the cutting edge portion during the cutting process.

<Cutting Test 2>

With regard to each of the surface-coated cutting tools of the sample numbers shown in the following Table 6, the cutting time shown in Table 6 was measured until the wear amount of the flank face reached 0.4 mm under the following cutting conditions, and the final damage state of the cutting edge was observed. The results thereof are shown in Table 6. The results show that the longer the cutting time is, the more the wear resistance is excellent. The results also show that the more the final damage state is close to the state of normal wear, the more the chipping resistance is excellent.

<Cutting Conditions>

Workpiece: FC250 end face processing cut

Circumferential speed: 300 m/min

Feeding speed: 0.35 mm/rev

Cutting amount: 1.0 mm

Cutting fluid: None

TABLE 6

| Sample No. | Cutting Time (Minute) | Final Damage State |
| --- | --- | --- |
| 1 | 5.0 | Normal Wear |
| 2 | 5.5 | Normal Wear |
| 5 | 4.5 | Micro-Breakage of End Cutting Edge |
| 6 | 5.0 | Normal Wear |
| 7 | 5.0 | Normal Wear |
| 8 | 4.5 | Micro-Chipping of End Cutting Edge |
| 11 | 6.0 | Normal Wear |
| 12 | 5.0 | Normal Wear |
| 15 | 5.5 | Normal Wear |
| 17 | 6.0 | Normal Wear |
| 18 | 5.5 | Normal Wear |
| 21 | 4.5 | Micro-Breakage of End Cutting Edge |
| 24 | 5.0 | Normal Wear |
| 25 | 5.5 | Normal Wear |
| 31 | 0.5 | Breakage |
| 32 | 2.0 | Chipping of End Cutting Edge |
| 33 | 1.5 | Large Wear of Flank Face |

As can be seen from Table 6, it is apparent that Examples (sample numbers 1 to 25) of the present invention are excellent both in wear resistance and chipping resistance as compared to Comparative Examples (sample numbers 31 to 33).

In the final damage state in Table 6, "normal wear" means a damage state caused only by wearing without occurrence of chipping, breakage and the like (having a smooth wearing surface), "micro-breakage of end cutting edge" means an extremely small chipped portion occurring in the cutting edge portion forming a finished surface in which the base material is recognized as being exposed, "micro-chipping of end cutting edge" means an extremely small chipped portion occurring in the cutting edge portion forming a finished surface, "breakage" means a large chipped portion occurring in the cutting edge portion, "chipping of end cutting edge" means a small chipped portion occurring in the cutting edge portion forming a finished surface, and "large wear of flank face" is wear occurring in the flank face of the tool and means that wear obviously rapidly progresses with respect to a certain reference.

<Cutting Test 3>

With regard to each of the surface-coated cutting tools of the sample numbers shown in the following Table 7, the number of times of impacts occurring until breakage occurs shown in Table 7 was measured under the cutting conditions as described below, and the final damage state of the cutting edge was observed. The results thereof are shown in Table 7. The results show that the greater the number of times of impacts occurring until breakage occurs is, the more the chipping resistance is excellent. The results also show that the more the final damage state is close to wear breakage, the more the wear resistance is excellent.

<Cutting Conditions>

Workpiece: strong intermittent cutting of outer diameter of FCD650 having 4 grooves Circumferential speed: 250 m/min Feeding speed: 0.30 mm/rev Cutting amount: 1.5 mm Cutting fluid: existing

TABLE 7

| Sample No. | Number of Times of Impacts Occurring until Breakage Occurs | Final Damage State |
| --- | --- | --- |
| 3 | 6250 | Wear Breakage |
| 4 | 4000 | Wear breakage, Micro-Chipping of Tip |
| 9 | 4660 | Wear Breakage |
| 10 | 5530 | Wear Breakage |
| 13 | 3250 | Breakage Caused by Boundary Wear |
| 14 | 5250 | Wear Breakage |
| 16 | 4750 | Wear Breakage |
| 19 | 5200 | Wear Breakage |
| 20 | 5800 | Wear Breakage |
| 22 | 4900 | Wear Breakage |
| 23 | 6300 | Wear Breakage |
| 34 | 1000 | Peeling Breakage |
| 35 | 2000 | Wear Breakage |
| 36 | 1500 | Chipping Breakage |

As can be seen from Table 7, it is apparent that Examples (sample numbers 3 to 23) of the present invention are excellent both in wear resistance and chipping resistance as compared to Comparative Examples (sample numbers 34 to 36).

In addition, in the final damage state in Table 7, "wear breakage" means a large chipped portion occurring in the cutting edge portion by undergoing the wear process, "wear breakage, micro-chipping of tip" means a combined type of damage accompanied by wear breakage and chipping at the tip of the cutting edge, "breakage caused by boundary wear" means that the tool is broken by undergoing the wear process occurring in the boundary between the cutting part and the non-cutting part of the cutting edge involved in cutting, "peeling breakage" means that the adhesive force between the coating film and the base material is weak, so that the coating film is peeled off during cutting and the base material is exposed to thereby cause progress of the tool damage, with the result that a large chipped portion is finally produced, and "chipping breakage" means that a small chipped portion occurring in the cutting edge portion grows over time, to cause breakage of the tool.

Although the embodiments and examples of the present invention have been explained as described above, it is also intended from the beginning to combine the configurations of the above-described embodiments and examples as appropriate.

It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

The invention claimed is:

1. A surface-coated cutting tool comprising:
a base material; and
a coating film formed on said base material, wherein
said coating film includes at least one TiCN layer,
said TiCN layer has a columnar crystal region, and
said columnar crystal region has a composition of $TiC_xN_y$ (in which $0.65 \leq x/(x+y) \leq 0.90$) and has a (422) plane of a plane spacing of 0.8765 Å to 0.8780 Å, and has TC (422) showing a maximum value in an orientation index TC (hkl).

2. The surface-coated cutting tool according to claim 1, wherein
said coating film includes at least one alumina layer, and
said alumina layer is made of an α-type aluminum oxide and has an average thickness of 2 μm to 15 μm.

3. A method of manufacturing a surface-coated cutting tool including a base material and a coating film formed on said base material, said coating film including at least one TiCN layer, said method comprising the step of:
forming said TiCN layer,
said step being performed by supplying raw material gas having a volume equal to or greater than 10 times as much as a volume of a reaction chamber of a chemical vapor deposition apparatus to the chemical vapor deposition apparatus per minute, to form said TiCN layer by a chemical vapor deposition method, and
said raw material gas containing at least $C_2H_4$.

* * * * *